United States Patent
Prunchak et al.

(10) Patent No.: US 12,180,568 B2
(45) Date of Patent: Dec. 31, 2024

(54) SOFT-MAGNETIC POWDER COMPRISING COATED PARTICLES

(71) Applicant: BASF SE, Ludwigshafen am Rhein (DE)

(72) Inventors: Robert Prunchak, Union, NJ (US); Jose A. Jimenez, Augusta, GA (US); Rene Koenig, Ludwigshafen am Rhein (DE); Rastko Joksimovic, Ludwigshafen am Rhein (DE)

(73) Assignee: BASF SE, Ludwigshafen am Rhein (DE)

( * ) Notice: Subject to any disclaimer, the term of this patent is extended or adjusted under 35 U.S.C. 154(b) by 143 days.

(21) Appl. No.: 17/791,572

(22) PCT Filed: Jan. 7, 2021

(86) PCT No.: PCT/EP2021/050195
§ 371 (c)(1),
(2) Date: Jul. 8, 2022

(87) PCT Pub. No.: WO2021/140156
PCT Pub. Date: Jul. 15, 2021

(65) Prior Publication Data
US 2022/0379373 A1    Dec. 1, 2022

(30) Foreign Application Priority Data
Jan. 10, 2020  (EP) ..................................... 20151101

(51) Int. Cl.
*B22F 1/16* (2022.01)
*B22F 1/00* (2022.01)
(Continued)

(52) U.S. Cl.
CPC ................ *C22C 33/02* (2013.01); *B22F 1/00* (2013.01); *B22F 1/05* (2022.01); *B22F 1/16* (2022.01);
(Continued)

(58) Field of Classification Search
CPC .......... B22F 1/16; B22F 2301/35; H01F 1/20
See application file for complete search history.

(56) References Cited

U.S. PATENT DOCUMENTS

| | | | |
|---|---|---|---|
| 6,613,383 | B1 | 9/2003 | George et al. |
| 6,713,117 | B1 | 3/2004 | Kodali |

(Continued)

FOREIGN PATENT DOCUMENTS

| | | |
|---|---|---|
| CN | 103046033 A | 4/2013 |
| CN | 108183012 A | 6/2018 |

OTHER PUBLICATIONS

International Preliminary Report on Patentability received for PCT Patent Application No. PCT/EP2021/050195, mailed on Nov. 5, 2021, 13 pages.
(Continued)

*Primary Examiner* — Adam Krupicka
(74) *Attorney, Agent, or Firm* — Faegre Drinker Biddle & Reath LLP

(57) ABSTRACT

The invention is related to a soft-magnetic powder comprising coated particles, the coated particles comprising a core and a shell, the core having an average particle size $D_{50}$ in a range from 0.1 μm to 100 μm and comprising iron, wherein the shell has a thickness of not more than 20 nm and comprises at least two solid oxides and wherein the shell comprises at least three layers and the shell comprises more than one layers of a first solid oxide and at least one layer of a second solid oxide, wherein the more than one layers of the first solid oxide and the at least one layer of the second solid
(Continued)

oxide are arranged in an alternating manner. The invention is further related to a process for the production of the soft-magnetic powder, a use of the soft-magnetic powder and an electronic component comprising the soft-magnetic powder.

12 Claims, 4 Drawing Sheets

(51) Int. Cl.
  *B22F 1/05*    (2022.01)
  *C22C 33/02*   (2006.01)
  *C23C 16/40*   (2006.01)
  *C23C 16/455*  (2006.01)
  *H01F 1/20*    (2006.01)
  *B22F 1/06*    (2022.01)

(52) U.S. Cl.
  CPC .......... *C23C 16/402* (2013.01); *C23C 16/403* (2013.01); *C23C 16/405* (2013.01); *C23C 16/45525* (2013.01); *H01F 1/20* (2013.01); *B22F 1/06* (2022.01); *B22F 2301/35* (2013.01); *B22F 2302/253* (2013.01); *B22F 2302/256* (2013.01)

(56) References Cited

U.S. PATENT DOCUMENTS

| | | |
|---|---|---|
| 6,913,827 B2 | 7/2005 | George et al. |
| 2008/0029300 A1 | 2/2008 | Harada et al. |
| 2010/0178510 A1 | 7/2010 | Kaneko et al. |
| 2018/0374619 A1 | 12/2018 | Orimo et al. |

OTHER PUBLICATIONS

International Search Report and Written Opinion received for PCT Patent Application No. PCT/EP2021/050195, mailed on Apr. 22, 2021, 11 pages.

Uudekull, et al., "Atomic layer deposition of titanium oxide films on As-synthesized magnetic Ni particles: Magnetic and safety properties," Journal of Magnetism and Magnetic Materials, vol. 429, May 1, 2017, pp. 299-304.

Xu, et al., "Comparison of sizing small particles using different technologies," Powder Technology, vol. 132, Issues 2-3, Jun. 24, 2003, pp. 145-153.

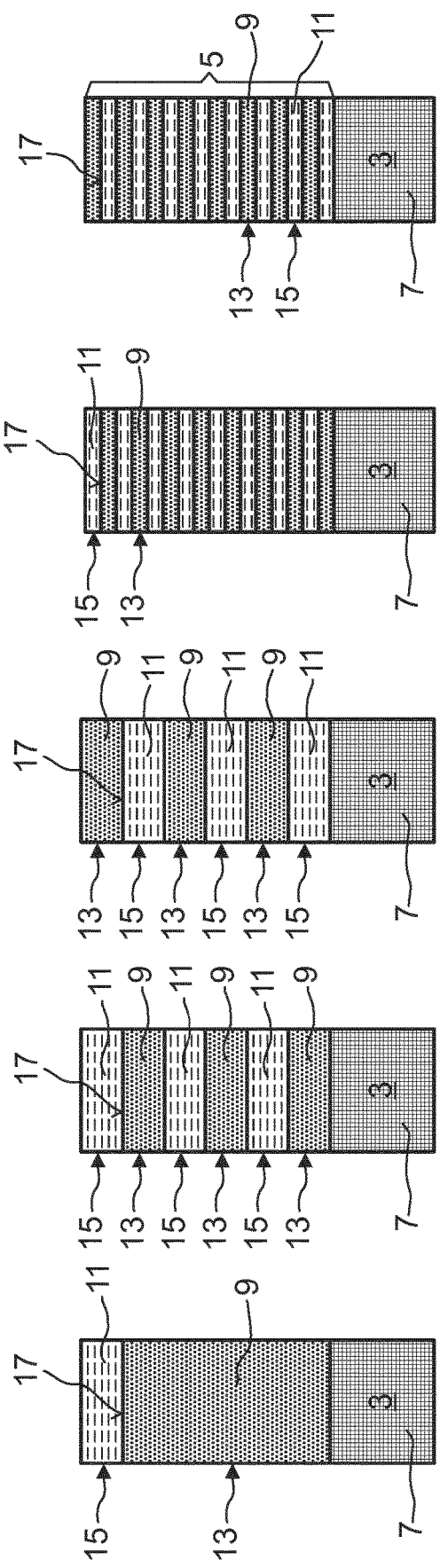

SOFT-MAGNETIC POWDER COMPRISING COATED PARTICLES

CROSS-REFERENCE TO RELATED APPLICATIONS

This application is a national stage application (under 35 U.S.C. § 371) of PCT/EP2021/050195, filed Jan. 7, 2021, which claims benefit of European Application No. 20151101.1, filed Jan. 10, 2020, both of which are incorporated herein by reference in their entirety.

The invention relates to a soft-magnetic powder comprising coated particles, the coated particles comprising a core and a shell, the core having an average particle size $D_{50}$ in a range from 0.1 µm to 100 µm and comprising iron. The invention is further related to a process for the production of the soft-magnetic powder, a use of the soft-magnetic powder and an electronic component comprising the soft-magnetic powder.

A popular application of soft-magnetic powder includes magnetic core components, which serve as piece of magnetic material with a high permeability used to confine and guide magnetic fields in electrical, electromechanical and magnetic devices such as electromagnets, transformers, electric motors, inductors and magnetic assemblies. These components are usually produced in different shapes and sizes by molding soft-magnetic powder in a die under high pressure.

In electronic applications, particularly in alternating current (AC) applications, the two key characteristics of the magnetic core component are the magnetic permeability and the core loss characteristic. In this context, the magnetic permeability of a material provides an indication of its ability to become magnetized or its ability to carry a magnetic flux. Permeability is defined as the ratio of the induced magnetic flux to the magnetizing force or field intensity. When a magnetic material is exposed to a rapidly varying field, the total energy of the core is reduced by the occurrence of hysteresis losses and/or eddy current losses. The hysteresis loss is caused by the necessary expenditure of energy to overcome the retained magnetic forces within the core component. The eddy current loss is caused by the production of electric currents in the core component due to the changing flux caused by AC conditions and basically results in a resistive loss.

Generally, devices for high frequency applications are sensitive to core losses and in order to reduce losses due to eddy currents good insulation of the soft-magnetic powder particles is desired. The simplest way of achieving this is thickening an insulating layer for each particle. However, the thicker the insulation layer is, the lower the core density of soft-magnetic particles gets and the magnetic flux density decreases. Thus, in order to manufacture a soft-magnetic powder core having optimal key characteristics, it is necessary to increase the resistivity and the density of the core simultaneously.

Iron-based powders have long been used as a base material in the manufacture of electronic components. Other uses of such powders include metal injection molded parts, powder metallurgy and various specialty products such as food supplements.

Known processes for forming insulating layers on magnetic particles typically tackle one of the key characteristics, i. e. the density or the insulation properties, while keeping the other constant. Therefore, the resistivity and magnetic permeability obtainable are limited.

To prevent metal surfaces from oxidation, different coating methods such as plasma spraying and sputtering are known. Atomic layer deposition (ALD) can be used to apply conformal coatings on particle substrates. ALD is a sequential, self-limiting, vapor based technique which allows deposition of uniform, conformal films with a thickness control at the atomic scale.

ALD is typically described as comprising or consisting of four steps that are repeated. The first step comprises a self-limiting reaction of a precursor, which is present in vapor phase. The second step comprises purging to remove gaseous reaction by-products and excess, also referred to as unreacted, precursor. The third step involves a self-limiting reaction of a second precursor, which is present in vapor phase. The fourth step involves purging, once again to remove gaseous reaction by-products and excess, also referred to as unreacted, precursor. The process described above is often referred to as one ALD reaction or one ALD cycle comprised of two half-reactions or half-cycles.

Wank et al. in "Coating fine iron particles with an oxidation-resistant γ-alumina nanolayer using ALD in a fluidized bed reactor", Fluidization XI, present and future of fluidization engineering, ECI Intl, Brooklyn (2004), pages 603 to 610, disclose fine iron particles which are coated with a thin crystalline γ-$Al_2O_3$ nanolayer.

King et al., "Functionalization of fine particles using atomic and molecular layer deposition", Powder Technology 221 (2012), pages 13 to 25, is directed to the functionalization of fine particles, wherein films of refractory oxides, non-oxides, metals and hybrid polymer-based materials are applied by atomic or molecular layer deposition. Insulating, semiconducting, metallic, polymeric and hybrid inorganic/organic films are built.

Cremers et al., "Oxidation barrier of Cu and Fe powder by Atomic Layer Deposition", Surface and Coatings Technology 349 (2018), pages 1032 to 1041, report on $Al_2O_3$ coatings, which are deposited on micrometer-sized Fe and Cu powder using thermal trimethylaluminum (TMA)/water ($H_2O$) process in a rotary pump-type ALD reactor.

Moghtaderi et al., "Combustion prevention of iron powders by a novel coating method", Chemical Engineering Technology (2006) 29, No. 1, pages 97 to 103, disclose fine iron powder particles with a protective barrier against rapid oxidation, wherein particles are individually coated with an alumina-based ultra-thin film using the Atomic Layer Deposition method. In order to overcome cracking caused by a thermal expansion mismatch between the particle and the alumina films, the protective film was generated from $Al_2O_3$ and ZnS.

King et al. in "Atomic Layer Deposition of UV-absorbing ZnO films on $SiO_2$ and $TiO_2$ nanoparticles using a fluidized bed reactor", Advanced Functional Materials (2008) 18, pages 607 to 615, studied the Atomic Layer Deposition to apply nanothick ZnO coatings on $SiO_2$ spheres for UV-blocking cosmetic particles and $TiO_2$ particles as novel inorganic sunscreen particles.

U.S. Pat. No. 6,613,383 B1, U.S. Pat. No. 6,713,117 B2 and U.S. Pat. No. 6,913,827 B2 disclose particles with an ultrathin, conformal coating using Atomic Layer Deposition methods. Nitride particles are coated with silica or alumina and nitride particles or carbide particles are coated with an oxide glass or a metal. Alumina, silica, titania or zeolite particles with a passivating coating as well as metal particles coated with an oxide coating, particles of an inorganic oxide, inorganic nitride or zeolite coated with a catalytically active metal and nanosized particles of metal or ceramic materials coated with a layer that protect the particles from oxidation such as silica or alumina are described.

It is an object of the present invention to provide a soft-magnetic powder with a high electrical resistivity, high corrosion resistance, high thermostability and high magnetic permeability.

This object is achieved by a soft-magnetic powder comprising coated particles, the coated particles comprising a core and a shell, the core having an average particle size $D_{50}$ in a range from 0.1 μm to 100 μm and comprising iron, wherein the shell has a thickness of not more than 20 nm and comprises at least two solid oxides and wherein the shell comprises at least three layers and the shell comprises more than one layers of a first solid oxide and at least one layer of a second solid oxide, wherein the more than one layers of the first solid oxide and the at least one layer of the second solid oxide are arranged in an alternating manner. The shell can comprise for example at least a first solid oxide and a second solid oxide. The soft-magnetic powder is obtainable by a process wherein the shell is deposited on the core by Atomic Layer Deposition (ALD).

Additionally, the invention is directed to the use of the soft-magnetic powder for coil cores, magnetorheological fluids (MRF), power injection molding, radio-frequency identification tags or electromagnetic shielding, as well to an electronic component comprising the soft-magnetic powder.

The shell according to the invention is highly conformal and able to coat high aspect ratio features and internal pores. Especially due to the gas phase deposition technique since the precursor vapor is able to diffuse into pores, cracks or through boundaries, which is difficult for wet or dry or other line of sight coating processes. Since uncoated iron regions are vulnerable to gas phase degradation such as oxidation, protecting such surfaces using a gas phase technique such as ALD, results in a superior powder. A wide range of chemistries concerning the shell and a wide range of structures concerning the core is possible.

The thickness of the shell can be controlled by ALD on an angstrom-level and no shadowing effects occur. Further, the coating of the shell is highly repeatable and scalable. In order to measure the thickness of the shell and/or the layers, cross-sections of the soft-magnetic powder can be prepared, using a focused ion beam (FIB), and examined using HAADF-STEM (High Angle Annular Dark Field—Scanning Transmission Electron Microscopy) with EDXS (Energy Dispersive X-ray Spectroscopy). Mapping the distribution of elements in the sample is enabled and the chemical composition of the shell and/or layers in weight-% can be derived. The particle size, in particular the average particle size $D_{50}$, of the core can for example be determined by Laser diffraction analysis. For this purpose a LS13320 Laser Diffraction Particle Size Analyzer from Beckman Coulter comprising an Aqueous liquid module—Modul might by applied. During sample preparation soft-magnetic powder is for example suspended in demineralized water comprising $Na_4P_2O_7$ and then circulated by a pump through a measuring cell. From a laser source a laser beam is directed to the measuring cell. Each of the particles causes scattered light, which is captured by a detector. The scattered light intensity is transformed into signals, which are converted into a volume distribution by a high-resolution iteration algorithm applying an optic model.

The shell can also be referred to as ALD coating. The shell comprises at least three layers, wherein each of the at least three layers comprises one, preferably exactly one, of the at least two solid oxides. Especially, at least two layers comprise different solid oxids of the at least two solid oxides, respectively. The shell comprises more than one layers of the first solid oxide and at least one layer of the second solid oxide. The first solid oxide is one of the at least two solid oxides and the second solid oxide is one of the at least two solid oxides.

Due to the thin and preferably structured shell, a conformal and pinhole-free coating is achieved, which possesses a high resistivity. By the combination of at least two different materials, namely the at least two solid oxides, different properties of the soft-magnetic powder can be improved simultaneously and cracks in the coating can be detracted or inhibited.

Interfaces between two adjacent layers of the at least three layers can constitute a diffusion barrier protecting the core against degradation.

The coated particles may vary in shape. In respect of the shape, numerous variants known to the person skilled in the art are possible. The coated particles may, for example, be needle-shaped, cylindrical, plate-shaped, teardrop-shaped, flat or spherical. Particles with various particle shapes are commercially available. Preferred is a spherical shape as such particles can be coated easily, which in fact results in a more effective insulation against electrical current. The core has preferably an average particle size $D_{50}$ in a range from 1 μm to 20 μm, more preferably from 3 μm to 8 μm.

The core preferably comprises carbonyl iron powder (CIP), such that the iron comprised in the core is CIP, and particularly consists of CIP. Carbonyl iron can be obtained according to known processes by thermal decomposition of iron pentacarbonyl in a gas phase, as described, for example, in Ullmann's Encyclopedia of Industrial Chemistry, 5th Edition, Vol. A 14, page 599 or in DE 3 428 121 or in DE 3 940 347, and contains particularly pure metallic iron.

Carbonyl iron powder is a gray, finely divided powder of metallic iron having a low content of secondary constituents and consisting essentially of spherical particles having a mean particle diameter of up to 100 μm. Unreduced carbonyl iron powder, which is preferred in the present context, has an iron content of >97% by weight (here based on the total weight of the core), a carbon content of <1.5% by weight, a nitrogen content of <1.5% by weight and an oxygen content of <1.5% by weight. Reduced carbonyl iron powder, which is particularly preferred in the process of the present invention, has an iron content of >99.5% by weight (here based on the total weight of the core), a carbon content of <0.1% by weight, a nitrogen content of <0.01% by weight and an oxygen content of <0.5% by weight. The mean diameter of the powder particles is preferably from 1 μm to 10 μm and their specific surface area (BET of the powder particles) is preferably from 0.1 m$^2$/g to 2.5 m$^2$/g.

Preferably, the shell has a thickness of not more 15 nm, more preferably not more than 10 nm. The shell preferably consists of the at least two solid oxides.

The shell comprises at least three layers and the shell comprises more than one layers of the first solid oxide and at least one layer of the second solid oxide, wherein the more than one layers of the first solid oxide and the at least one layer of the second solid oxide are arranged in an alternating manner. The alternating manner is understood in the frame of the present invention as a sequence of layers of the first solid oxide and at least one layer of the second solid oxide, wherein the order of the layer with respective oxide alternates from the core to the surface of the coated particles. The core can firstly be coated with the layer of the first solid oxide and then with the layer of the second solid oxide. It is also possible that the core is firstly coated with the layer of the second solid oxide followed by the layer of the first solid oxide.

The shell can comprise a sequence of several numbers of layers of each of the at least two solid oxides. The number of layers of each of the at least two solid oxides can be equal to each other.

For example, the shell can comprise a sequence of several numbers of layers of the first solid oxide and several numbers of layers of the second solid oxide. The number of layers of the first solid oxide comprised in the shell can be equal to the number of layers of the second solid oxide comprised in the shell. The shell can comprise for example two layers of the first solid oxide and/or two layers of the second solid oxide, or four layers of the first solid oxide and/or four layers of the second solid oxide, or six layers of the first solid oxide and/and six layers of the second solid oxide, or eight layers of the first solid oxide and/or eight layers of the second solid oxide. According to the arrangement in the alternating manner, one layer of the first solid oxide is arranged for example between two layers of the second solid oxide or one layer of the second solid oxide is arranged between two layers of the first solid oxide.

For example, the shell can comprise two layers of the first solid oxide and two layers of the second solid oxide. In this case, the core can be coated by a sequence comprising a layer of the first solid oxide, which is arranged directly on the core, followed by a layer of the second solid oxide, which is in turn followed by another layer of the first solid oxide, which again is followed by another layer of the second solid oxide.

The shell can also comprise more than two solid oxides, wherein more preferably a third solid oxide is comprised in a layer of the third solid oxide, and in particular preferred the layer of the third solid oxide consists of the third solid oxide.

Preferably, the shell comprises from 3 to 20 layers. A thickness of each of the at least three layers is preferably in a range from 0.1 nm to 5 nm, more preferably from 1 nm to 3 nm, for example 2 nm. Typically, the thickness of each of the at least three layers depends on the numbers of ALD cycles, the process temperature and the chemical structure of the applied solid oxide, which is determined by the precursors selected.

Preferably, each of the at least two solid oxides is an oxide of a metal, a metalloid or a transition metal. A metalloid is for example an element selected from the third to sixth main group of the periodic table. More preferred, the metal is Al, the metalloid is Si and/or the transition metal is selected from the group consisting of Hf, Zn, Zr, Co, Mn, Ni and Ti. Particularly preferred, at least one of the at least two solid oxides is selected from the group consisting of $SiO_2$, $Al_2O_3$, $HfO_2$, $TiO_2$, ZnO, $ZrO_2$, CoO, MnO and NiO. Most preferred, a first solid oxide of the least two solid oxides is $Al_2O_3$ and/or a second solid oxide of the least two solid oxides is $ZrO_2$ or $SiO_2$, or vice versa.

Depending on the at least two solid oxides, preferably each of the at least three layers is amorphous, crystalline, such as polycrystalline, or a combination thereof. For example, a layer comprising $ZrO_2$ is a polycrystalline layer and a layer comprising $TiO_2$ is a crystalline layer.

In the context of the present invention, each of the at least two solid oxides is different from each other. The at least two solid oxides can differ from each other by the chemical composition and/or by the state of oxidation.

Preferably, in one layer one of the at least two solid oxides is predominantly present. Thus, the layer of each of the at least two solid oxides comprises preferably less than 50% by weight, more preferably less than 10% by weight and most preferably less than 5% by weight of the other solid oxides. Further, the layer of each of the at least two solid oxides comprises preferably more than 50% by weight, more preferably more than 90% by weight and most preferably more than 95% by weight of the corresponding solid oxide of the at least two solid oxides. Particularly preferred, the layer of each of the at least two solid oxides consists of the corresponding solid oxide of the at least two solid oxides. In particular, the layer of each of the at least two solid oxides consists of a monolayer of the corresponding solid oxide of the at least two solid oxides. Particularly preferred, in each of the layers one of the at least two solid oxides is predominantly present.

For example, the first solid oxide is predominantly present in the at least one layer of the first solid oxide and/or the second solid oxide is predominantly present in the at least one layer of the second solid oxide. Thus, the more than one layers of the first solid oxide each comprises preferably less than 50% by weight, more preferably less than 10% by weight and most preferably less than 5% by weight of the second solid oxide and the at least one layer of the second solid oxide preferably comprises less than 50% by weight, more preferably less than 10% by weight and most preferably less than 5% by weight of the first solid oxide. Correspondingly, the more than one layers of the first solid oxide each comprises preferably more than 50% by weight, more preferably more than 90% by weight and most preferably more than 95% by weight of the first solid oxide and the at least one layer of the second solid oxide preferably comprises more than 50% by weight, more preferably more than 90% by weight and most preferably more than 95% by weight of the second solid oxide. Particularly preferred, the more than one layers of the first solid oxide each consists of the first solid oxide and the at least one layer of the second solid oxide consists of the second solid oxide. For example, the more than one layers of the first solid oxide each consists of a monolayer of the first solid oxide and/or the at least one layer of the second solid oxide consists of a monolayer of the second solid oxide.

Preferably, the soft-magnetic powder has a relative magnetic permeability of at least 17.5, the relative magnetic permeability being defined as a ratio between the permeability of a sample and the permeability of a vacuum.

In a preferred embodiment, the more than one layers of the first solid oxide each comprises $Al_2O_3$ and one of the more than one layers of the first solid oxide is arranged directly on the core of the coated particles such that part of the iron comprised in the core is in direct contact with the $Al_2O_3$.

Iron, which is comprised in the core and located at the surface of the core, can be present in form of FeO, $Fe_2O_3$ and/or $Fe_3O_4$.

In an alternative embodiment, the more than one layers of the first solid oxide each comprises $ZrO_2$ and one of the more than one layers of the first solid oxide is arranged directly on the core of the coated particles such that part of the iron comprised in the core is in direct contact with the $ZrO_2$.

In one embodiment, the shell can comprise the at least two solid oxides, wherein a concentration gradient of the first solid oxide and/or the second solid oxide exists in the shell, preferably in radial direction, from the core to the surface of the coated particle. The concentration of the first solid oxide can increase or decrease from the core to the surface of the coated particle and/or the concentration of the second solid oxide can increase or decrease from the core to the surface of the coated particle. Preferably, the concentration of the first solid oxide decreases from the core to the surface of the coated particle and the concentration of the second solid oxide increases from the core to the surface of the coated particle The invention is further directed to a process for the production of the soft-magnetic powder, wherein the shell is deposited on the core by atomic layer deposition (ALD). Preferably, each of the at least three layers is produced by ALD and more preferably each of the at least three layers is produced by more than one cycle of ALD. One cycle of ALD includes one performance of a set of alternating half-reactions for the deposition of one of the at least two solid oxide. The number of cycles is dictated by the process conditions, such as temperature, by the choice of the precursor and by the desired thickness of the layer. For example up to 90 cycles or up to 50 cycles or up to 40 cycles of ALD can be effectuated to produce each of the at least three layers.

As an illustrative example, once one layer of the first solid oxide is accomplished by effectuating the corresponding half-reactions six times, the ALD procedure is repeated for additional six times, now with another set of half-reactions, in order to accomplish one layer of the second solid oxide.

For example, a shell with a total thickness of 11 nm, comprising a layer of $ZrO_2$ with a thickness of 3.6 nm, which is arranged between two layers of $Al_2O_3$, each with a thickness of 3.6 nm, can be prepared at 180° C. by utilizing 30 alternating half cycles of trimethyl aluminium and water followed by 30 alternating half cycles of tetrakis(dimethylamido) zirconium and water followed by additional 30 alternating half cycles of trimethyl aluminium and water. It is assumed that each precursor is dosed to saturation and that sufficiently long purge cycles are used after each half-cycle.

A similar shell thickness can also be achieved at 250° C. by using a total of 99 cycles rather than the aforementioned 90 cycles by using a particular precursor providing a growth rate, which diminishes slightly at higher temperatures. The density of the resulting layers and thus the barrier quality may be changed by selecting different deposition temperatures.

By comparison, a similarly thick and structured shell utilizing 3.6 nm of $TiO_2$ arranged between two 3.6 nm layers of $SiO_2$ prepared at 200° C. is preferably produced by 72 alternating half cycles of Tris(dimethylamido) silane and ozone followed by 90 alternating half cycles of Titanium (IV) isopropoxide and ozone followed by additional 72 alternating half cycles of Tris(dimethylamido) silane and ozone. It is assumed that each precursor is dosed to saturation and sufficiently long purge cycles were used after each half-cycle.

ALD permits the formation of deposits of up to about 0.3 nm in thickness per reaction cycle, and thus provides a means of extremely fine control over deposit thickness. In this technique, the deposits are formed in a series of two or more self-limited reactions, which can be repeated to sequentially deposit additional layers of the deposited material until a desired thickness is achieved. Typically, the first of these reactions will involve some functional group, such as an M-H, M-O—H, M-OH, M-O—OH or M-N—H group, where M represents preferably an atom of a metal, a metalloid or a transition metal on the surface of the particle, which is preferably the surface of the core or the surface of an outer layer, which is already present on the core. The individual reactions are advantageously carried out separately and under conditions such that all excess reagents and reaction products are removed before conducting the succeeding reaction.

It is preferred to treat the particles before initiating the reaction sequence to remove volatile materials that may be absorbed onto the surface. This is readily done by exposing the particles to elevated temperatures and/or vacuum. Also, in some instances a pretreatment reaction may be done to introduce desirable functional groups onto the surface of the particle, as described before. The core can be pretreated with $H_2$, $H_2O$ or $O_3$ before depositing the shell on the core.

The at least two solid oxides can be deposited on particles using a binary (AB) reaction sequence as follows. The asterisk (*) indicates the atom that resides at the surface of the particle, and Z represents oxygen or nitrogen. $M^1$ is preferably an atom of a metal (or a metalloid or a transition metal), particularly one having a valence of 3 or 4, and X is a displaceable nucleophilic group. The reactions shown below are not balanced, and are only intended to show the reactions at the surface of the particles, i.e., not inter- or intralayer reactions.

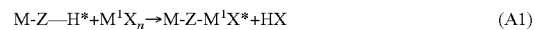

$$M\text{-}Z\text{—}H^* + M^1X_n \rightarrow M\text{-}Z\text{-}M^1X^* + HX \qquad (A1)$$

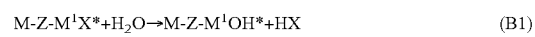

$$M\text{-}Z\text{-}M^1X^* + H_2O \rightarrow M\text{-}Z\text{-}M^1OH^* + HX \qquad (B1)$$

In reaction A1, reagent $M^1X_n$ reacts with one or more M-Z—H* groups on the surface of the particle to create a new surface group having the form -$M^1X$. $M^1$ is bonded to the particle through one or more Z atoms. The -$M^1X$ group represents a site that can react with water in reaction B1 to regenerate one or more hydroxyl groups. The hydroxyl groups formed in reaction B1 can serve as functional groups through which reactions A1 and B1 can be repeated, each time adding a new layer of $M^1$ atoms. Note that in some cases (such as, e.g., when $M^1$ is silicon, zirconium, titanium, boron, yttrium or aluminum) hydroxyl groups can be eliminated as water, forming $M^1$-O-$M^1$ bonds within or between layers. This condensation reaction can be promoted if desired by, for example, annealing at elevated temperatures and/or reduced pressures.

Binary reactions of the general type described by equations A1 and B1, where $M^1$ is Zn, are described for example in King et al., "Atomic layer deposition of UV-absorbing ZnO films on $SiO_2$ and $TiO_2$ nanoparticles using a fluidized bed reactor", Advanced Functional Materials, 2008, 18, pages 607 to 615. Binary reactions of the general type described by equations A1 and B1, where $M^1$ is aluminum, are described for example in Moghtaderi et al., "Combustion prevention of iron powders by a novel coating method", Chemical Engineering Technology, 2006, 29, No. 1, pages 97 to 103. Analogous reactions for the deposition also of other solid oxides are described in King et al., "Functionalization of fine particles using atomic and molecular layer deposition", Powder Technology 221 (2012), pages 13 to 25.

A specific reaction sequence of the A1/B1 type that produces an alumina layer is:

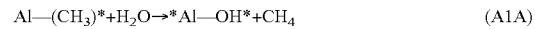

$$Al\text{—}(CH_3)^* + H_2O \rightarrow {}^*Al\text{—}OH^* + CH_4 \qquad (A1A)$$

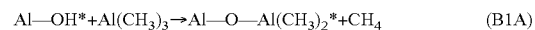

$$Al\text{—}OH^* + Al(CH_3)_3 \rightarrow Al\text{—}O\text{—}Al(CH_3)_2^* + CH_4 \qquad (B1A)$$

This particular sequence of reactions is particularly preferred to deposit alumina, as the reactions proceed well at relatively low temperatures. This particular reaction sequence tends to deposit $Al_2O_3$ at a rate of 1.2 Å per AB cycle. Triethyl aluminum (TEA) can be used in place of trimethyl aluminum, although trimethyl-aluminum (TMA) is preferred.

In the foregoing reaction sequence preferred $M^1$ include Si, Al, Hf, Ti, Zn, Zr, Co, Mn and Ni. Suitable replaceable nucleophilic groups can vary with the chosen $M^1$, but include, for example, fluoride, chloride, bromide, alkoxy, alkyl, acetylacetonate, cyclopentadienyls, β-diketonates, amides, amidinates and the like. Specific precursors that are of particular interest are trimethyl aluminum (Al(CH$_3$)$_3$), tris(dimethylamido) silane, tetraethylorthosilicate (Si(OC$_2$H$_5$)$_4$), diethyl zinc, tetrakis(dimethylamido) zirconium (IV), tetrakis(dimethylamido) hafnium(IV), bis(ethylcyclopentadienyl) manganese(II), nickel bis(N,N'-ditertialbutylacetamidinate), tetrakis(dimethylamino) titanium, and the like. H$_2$O, O$_3$, and H$_2$O$_2$ are commonly used co-reactants for such ALD processes.

The precursors mentioned above are for illustrative purposes only and are not intended to be an exhaustive list. For example, a TiO$_2$ coating could be achieved via ALD by using TiCl$_4$, titanium(IV) isopropoxide or tetrakis(dimethylamino)titanium as a precursor in combination with H$_2$O. The precursors can differ in stability, vapor pressure, reactivity, and/or growth rate. The vapor pressure is a key characteristic of a suitable precursor. Often, the precursor is heated to increase the resulting vapor pressure to achieve the desired reaction.

For example for the deposition of Al$_2$O$_3$ the overall stoichiometry can be given as follows, which is further illustrated in Puurunen, "Surface chemistry of atomic layer deposition: a case study for the trimethylaluminum/water process", Journal of Applied Physics, 97, 121301 (2005):

$$Al(CH_3)_3(g) + 3/2 H_2O(g) \rightarrow \tfrac{1}{2} Al_2O_3(s) + 3 CH_4(g)$$

The reactions, also referred to as half-reactions, for the deposition of Al$_2$O$_3$ on a hydroxyl rich surface using trimethyl aluminum can read more precisely below, where "II-" stands for the surface site containing the hydroxyl group.

$$\text{II-OH} + Al(CH_3)_3 \rightarrow \text{II-O}\text{—}Al(CH_3)_2 + CH_4 \tag{1}$$

$$2\text{II-OH} + Al(CH_3)_3 + (\text{II-O})_2\text{—}AlCH_3 + 2CH_4 \tag{2}$$

The half reaction liberates methane. After adequate purging, the second half-reaction using a water dose then proceeds to regenerate the hydroxyl rich surface and in the process also liberating methane:

$$\text{II-O}\text{—}Al(CH_3)_2 + 2H_2O \rightarrow \text{II-O}\text{—}Al(OH)_2 + 2CH_4 \tag{3}$$

The binary reactions are generally performed at elevated temperatures, preferably from 300 K to 1000 K, more preferably less than 600 K. Preferably, the deposition of the shell on the core, especially the deposition of the at least three layers is effectuated at a deposition temperature from 400 K to 600 K, more preferred from 500 K to 580 K.

During and between reactions, the particles are typically subjected to conditions sufficient to remove reaction products and unreacted reagents. This can be done, for example, by subjecting the particles to a vacuum, such as 100 Pa or less. This is often done while exposing the particles to an inert purge gas between the reaction steps. This purge gas can also act as a fluidizing medium for the particles and as a carrier for the reagents. Suitable purge gases are for example argon or nitrogen.

Such ALD reactions can also be performed at atmospheric pressure, though much higher volumes of inert carrier gas and purge gas are required to achieve the desired coating.

Several techniques are useful for monitoring the progress of the reaction. For example, vibrational spectroscopic studies can be performed using transmission Fourier transform infrared techniques. Mass spectrometry is also commonly used to monitor the progress of the ALD reaction. X-ray photoelectron spectroscopy is a useful, surface sensitive technique that can often be suitable in evaluating ALD coated powders.

A convenient method for applying the ultrathin deposits of the at least two solid oxides to the particles is to form a fluidized bed of the particles, and then pass the various reagents in turn through the fluidized bed under reaction conditions. Methods of fluidizing particulate materials are well known, and generally include supporting the particles on a porous plate or screen. A fluidizing gas is passed upwardly through the plate or screen, lifting the particles somewhat and expanding the volume of the bed. With appropriate expansion, the particles behave as a fluid. Fluid (gaseous or liquid) reagents can be introduced into the bed for reaction with the surface of the particles. The fluidizing gas also can act as an inert purge gas for removing unreacted reagents and volatile or gaseous reaction products. Fluidization of the powder is not required, though often preferred to ensure proper dosing of precursors and removal of reactants. Movement of cohesive powders, such that Geldart C-type powders, can be improved through the use of additional vibration.

The reactions can alternatively be conducted in a rotating cylindrical vessel or a rotating tube. A rotating reactor can comprise a hollow tube that contains the particles. The reactor can be held at an angle to the horizontal, and the particles can pass through the tube through gravitational action. The reactor angle determines the flow rate of the particles through the reactor. The reactor can be rotated in order to distribute individual particles evenly and expose all particles to the reactants. The reactor design permits the substrate particles to flow in a near plug-flow condition, and is particularly suitable for continuous operations. The reactants are introduced individually and sequentially through the reactor, preferentially countercurrent to the direction of the substrate particles. The invention is not limited to the illustrated examples of reactor concepts.

The soft-magnetic powder according to the present invention is particularly suitable for the manufacture of electronic components. Electronic components such as magnetic cores may be obtained by e.g. press molding or injection molding the coated particles. To manufacture such electronic components, the soft-magnetic powder is typically incorporated with one or more types of resin, such as epoxy resin, urethane resin, polyurethane resin, phenolic resin, amino resin, silicon resin, polyamide resin, polyimide resin, acrylic resin, polyester resin, polycarbonate resin, norbornene resin, styrene resin, polyether sulfone resin, silicon resin, polysiloxane resin, fluororesin, polybutadiene resin, vinyl ether resin, polyvinyl chloride resin or vinyl ester resin. The method of mixing these components is not limited, and the mixing may be effected by a mixer, e.g. ribbon blender, tumbler, Nauta mixer, Henschel mixer or supermixer or kneading machine, e.g. Banbury mixer, kneader, roll, kneader-extruder, paddle mixer, planetary mixer or monoaxial or biaxial extruder.

One method of producing moldings from the soft-magnetic powder includes using a so called ready-to-press powder, which contains the coated soft-magnetic powder, which is further coated with resin according to the description above. Such ready-to-press powder can be pressed in a mold at pressures up to 1000 M Pa, preferably up to 500 M Pa with or without heating. After compression the molding is preferably left to cure. A process to coat the soft-magnetic powder with resin preferably comprises for example the steps of dissolution of the resin, e.g. epoxy resin, in a solvent, addition of the soft-magnetic powder to the mixture, removal of the solvent from the mixture to give a dry product, and grinding of the dry product to give the readyto-press powder. The ready-to-press powder is preferably used to produce a magnetic or magnetisable molding.

Powder injection molding allows to produce complex metal parts cost effectively and efficiently. Powder injection molding typically includes compounding the soft-magnetic powder together with a polymer and molding it into the desired shape. If required for the targeted application, the polymer is then preferably removed and the molded part is preferably converted into a solid metal part in a sintering phase. This works particularly well with carbonyl-iron powder because the spherical iron particles can be packed together very tightly.

Particularly moldings of the soft-magnetic powder can be used as coil cores or coil formers as employed in electrical engineering. Coils with corresponding coil cores or coil formers are used by way of example as electromagnets, in generators, in transformers, in inductors, in laptop computers, in netbooks, in mobile telephones, in electric motors, in AC inverters, in electronic components in the automobile industry, in toys, in the electronics industry and in magnetic-field concentrators. Electronic components are in particular magnetic core components as used in electrical, electro-mechanical and magnetic devices such as electromagnets, transformers, electric motors, inductors and magnetic assemblies. The soft-magnetic powder can moreover be used to produce magnetic-field concentrators.

In addition, electronic components manufactured of the soft-magnetic powder may be used for shielding electronic devices. In such applications, alternating magnetic field of the radiation causes the powder particles to continuously rearrange themselves. Due to the resulting friction, the powder particles convert the energy of the electromagnetic waves into heat.

Further applications of the soft-magnetic powder are in magnetorheological fluids (MRF).

BRIEF DESCRIPTION OF THE FIGURES

The present invention is described in more detail at hand of the accompanying schematic drawings and images, respectively, in which:

FIGS. 1 *a*) to 1 *d*) show cross-sections of a coated particles 1 comprising a core 3 and a shell 5. Six different coated particles 1 are represented. All coated particles 1 possess a core 3 comprising iron 7 and differ in the composition of the shell 5.

Figure 1A:
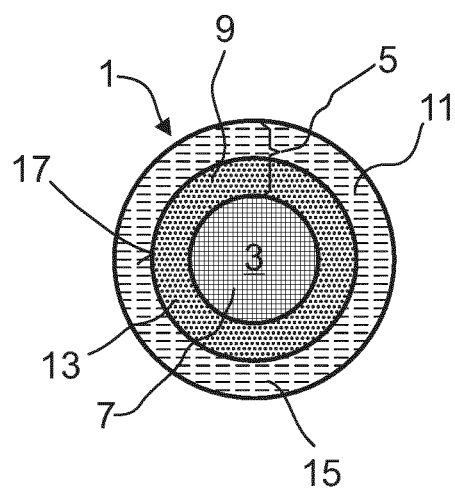
FIGS. 1 *a*)-*d*) shows cross-sections of a coated particle comprising a core and a shell, FIGS. 2 *a*)-*i*) shows detailed sections of a coated particle comprising a core and a shell.
Figure 1B:
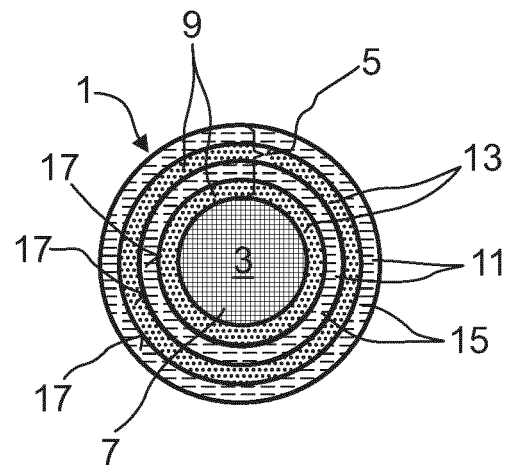
Figure 1C:
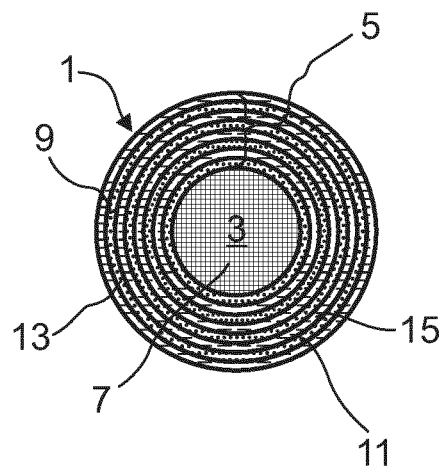
Figure 1D:
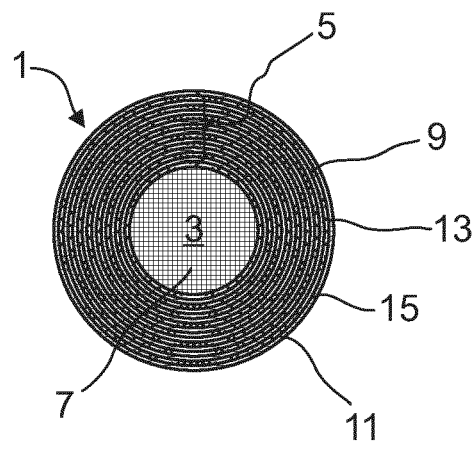
Figure 3A:
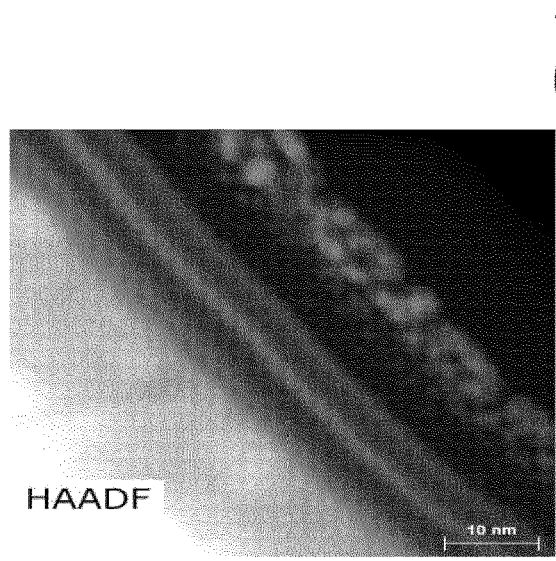
FIG. 3 shows TEM images of a coated particle comprising a core and a shell with layers and FIG. 4 shows an EDXS-Linescan of the coated particle according to FIG. 3.
Figure 3B:
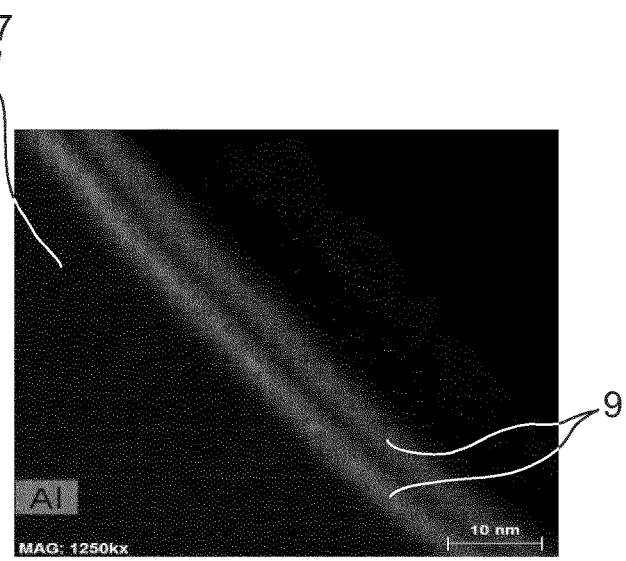
Figure 3C:
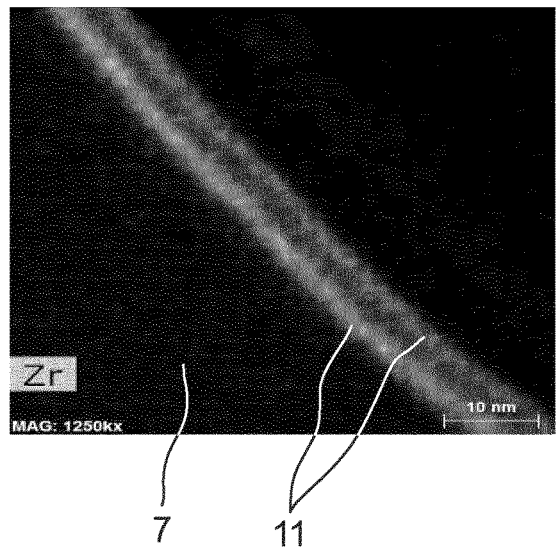
Figure 3D:
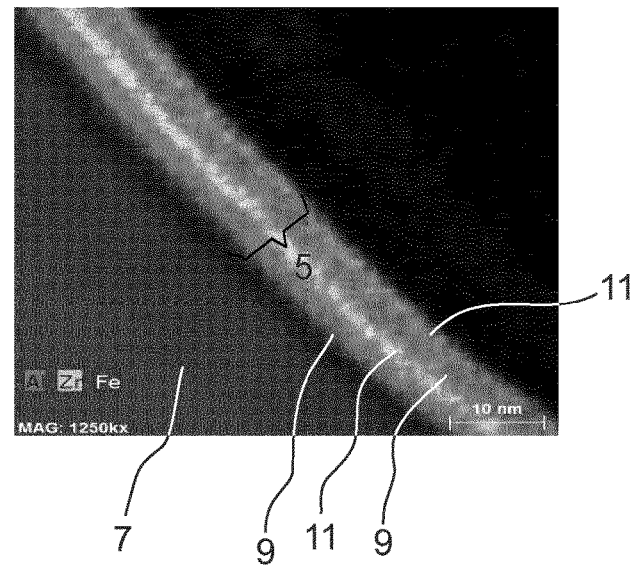

Coated particle 1, shown in FIG. 1 *a*), has a shell 5 on its core 3, wherein the shell 5 comprises a layer of a first solid oxide 13 and a layer of a second solid oxide 15. The layer of the first solid oxide 13 comprises a first solid oxide 9 and the layer of the second solid oxide 15 comprises a second solid oxide 11. Further, the shell 5 has an interface 17 between the layer of the first solid oxide 13 and the layer of the second solid oxide 15, where the first solid oxide 9 and the second solid oxide 11 are in contact with each other.

Coated particle 1, shown in FIG. 1 *b*), comprises a shell 5 comprising four layers 13, 15, namely two layers of the first solid oxide 13, comprising the first solid oxide 9, and two layers of the second solid oxide 15, comprising the second solid oxide 11. The layers of the first solid oxide 13 are arranged in an alternating manner with the layers of the second solid oxide 15. Further, the shell 5 possesses three interfaces 17, where one of the layers of the first solid oxide 13 is in contact with one of the layers of the second solid oxide 15.

Coated particle 1, shown in FIG. 1 *c*), comprises a core 3 and a shell 5, comprising four layers of the first solid oxide 13 and four layers of the second solid oxide 15, which are arranged in an alternating manner. The shell 5 possesses seven interfaces 17, each between one of the layers of the first solid oxide 13 and one of the layers of the second solid oxide 15, respectively.

Coated particle 1, shown in FIG. 1 *d*), comprises a core 3 and a shell 5, comprising eight layers of the first solid oxide 13 and eight layers of the second solid oxide 15, which are arranged in an alternating manner. The shell 5 possesses 15 interfaces, each between one of the layers of the first solid oxide 13 and one of the layers of the second solid oxide 15, respectively.

FIGS. 2 *a*) to 2 *i*) show detailed sections of nine different coated particles 1, each comprising a core 3, comprising iron 7 and a shell 5. The coated particles 1 differ in the composition of the shell 5, which are represented in more detail.

The section of coated particle 1, shown in FIG. 2 *a*), has a shell 5 comprising a layer of a first solid oxide 13, which comprises a first solid oxide 9, and a layer of a second solid oxide 15, which comprises a second solid oxide 11. The layer of the first solid oxide 13 is in contact with the layer of the second solid oxide 15 at an interface 17. Further, the layer of the first solid oxide 13 is located directly on the core 3 and followed by the layer of the second solid oxide 15. A thickness of the layer of the first solid oxide 13 is superior to a thickness of the layer of the second solid oxide 15.

The section of the coated particle 1, shown in FIG. 2 *b*), has a shell 5 comprising three layers of the first solid oxide 13 and three layers of the second solid oxide 15, which are arranged in an alternating manner. One layer of the first solid oxide 13 is arranged directly on the core 3. One layer of the second solid oxide 15 is arranged on the outside of the coated particle 1.

The represented section of coated particle 1, shown in FIG. 2 *c*), differs from coated particle 1 of FIG. 2 *b*) in that the order of three layers of the first solid oxide 13 and three layers of the second solid oxide 15 is inverted. The layers of the first solid oxide 13 and the layers of the second solid oxide 15 are also arranged in an alternating manner, but here starting with a layer of the second solid oxide 15, which is arranged directly on the core 3 and a layer of the first solid oxide 13 on the outside of the coated particle 1.

The represented section of coated particle 1, shown in FIG. 2 *d*), corresponds to coated particle 1 of FIG. 2 *b*) with the difference that the coated particle 1 *j*) comprises eight layers of the first solid oxide 13 and eight layers of the second solid oxide 15.

The section of coated particle 1, shown in FIG. 2 *e*), corresponds to coated particle 1 of FIG. 2 *c*), with the difference that the coated particle 1 comprises eight layers of the first solid oxide 13 and eight layers of the second solid oxide 15.

The section of coated particle 1, shown in FIG. 2 *f*), possesses a shell 5 comprising four layers of the first solid oxide 13 and four layers of the second solid oxide 15. One layer of the second solid oxide 15 is arranged directly on the core 3 and one layer of the first solid oxide 13 is arranged on the outside of the coated particle 1. A thickness of the layers of the second solid oxide 15 is superior to a thickness of the layers of the first solid oxide 13.

The section of coated particle 1, shown in FIG. 2 *g*), differs from the coated particle 1 of FIG. 2 *f*) in that the order of the layers of the first solid oxide 13 and the layers of the second solid oxide 15 is inverted as well as in the thickness of the layers. A layer of the first solid oxide 13, which is thicker compared to a layer of the second solid oxide 15, is arranged directly on the core 3 and the layer of the second solid oxide 15, which is thinner compared to the layer of the first solid oxide 13, is arranged on the outside of the coated particle 1.

The section of coated particle 1, shown in FIG. 2 *h*), has a core 3 with a shell 5. The shell 5 comprises a first solid oxide 9 and a second solid oxide 11. The first solid oxide 9 and the second solid oxide 11 are each arranged with a concentration gradient in the shell 5. The concentration of the first solid oxide 9 decreases from the core 3 to the outside of the coated particle 1, whereas the concentration of the second oxide 11 increases from the core to the outside of the coated particle 1.

The section of coated particle 1, shown in FIG. 2 *i*), corresponds to the coated particle 1 of FIG. 2 *h*) with the difference that the concentration gradients of the first solid oxide 9 and the second solid oxide 11 are inverted. In this shell 5 the concentration of the first solid oxide increases from the core 3 to the outside of the coated particle 1 and the concentration of the second solid oxide 11 decreases from the core 3 to the outside of the coated particle 1.

FIG. 3 shows transmission electron microscopy (TEM) images of a section of a coated particle 1 comprising a core 3 and a shell 5. The core 3 comprising iron 7 is represented at the lower left end of the images.

Image b) shows two illuminated layers of a first solid oxide 9, comprising aluminum, as part of the shell 5 of the coated particle 1. Image c) shows two illuminated layers of a second solid oxide 11, comprising zirconium, as part of the shell 5 of the coated particle 1.

On image d) the first solid oxide 9, comprising aluminum, as well as the second solid oxide 11, comprising zirconium, are illuminated such that the complete shell 5 of the coated particle 1 is visible.

Figure 4:
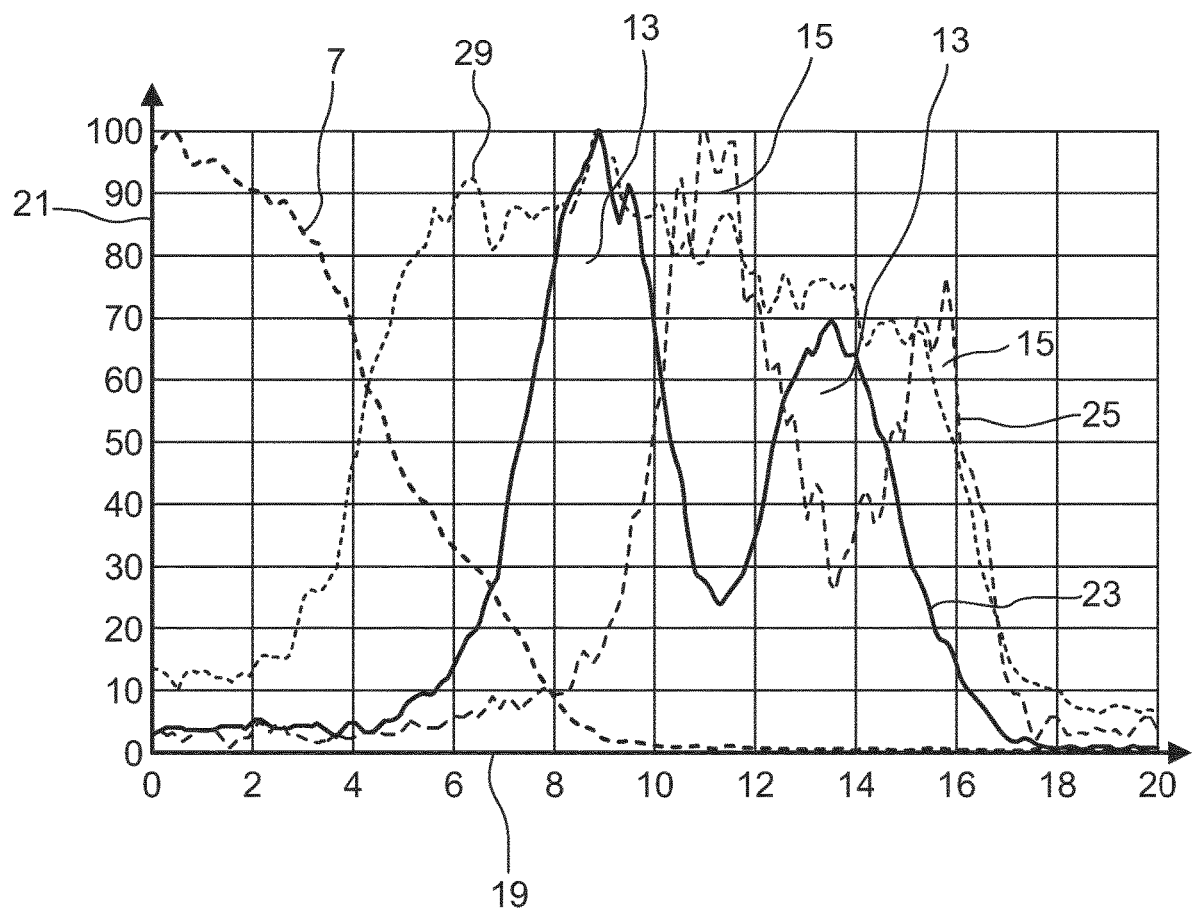

FIG. 4 shows an Energy-dispersive X-ray spectroscopy (EDXS)-Linescan of the coated particle according to FIG. 3. On the abscissae 19 a distance in nm, referring to the surface of the iron core, is given, whereas on an ordinate 21 net counts of the Linescan are shown in percent. Graphs are represented for detected iron 7, aluminum 23, zirconium 25 and oxygen 29. Two first layers 13, each comprising aluminum 23, and two second layers 15, each comprising zirconium 25, are visible.

Examples and Comparative Examples

Cores of carbonyl iron particles were coated by atomic layer deposition with $Al_2O_3$ or $ZrO_2$ alone or only comprising one layer of each oxide (compare samples 2 to 8) as comparative example. Further, cores of carbonyl iron particles were coated by atomic layer deposition with a combination of $Al_2O_3$ and $ZrO_2$ (compare samples 9 to 15) or with a combination of $Al_2O_3$ and $SiO_2$ (compare sample 16), see Table 1. Additionally, carbonyl iron particles without a coating (compare sample 1) were tested.

The chemical composition of the applied solid oxides, the number of layers in the shell and the number of ALD cycles for the production of one layer was varied as well as the deposition temperature.

Here, a layer of the first solid oxide was arranged directly on the core followed by a layer of the second solid oxide, where applicable. Layers of the first solid oxide and layers of the second solid oxide were arranged in an alternating manner. The total amount of layers covering the core and forming the shell is the sum of the indicated number of layers of the first solid oxide and the indicated number of layers of the second solid oxide.

For example 60 g of uncoated carbonyl iron powder was placed into a fluidized bed reactor (FBR) of a Beneq TFS200 ALD. The FBR was evacuated to a pressure of approximately 100 Pa while it was heated to 180° C. During the experiment nitrogen with a purity of 99.999 mol-% was led through the FBR with a flow in a range from 10 sccm to 20 sccm. The FBR was in addition mechanically vibrated to assist the movement of the powder. Off-gasses from the FBR were monitored in real time by utilizing a Vision 2000C quadrupole mass spectrometer/residual gas analyzer from MKS. The powder was dried under these conditions for 3.5 hours to remove physisorbed water.

TABLE 1

| | | First solid oxide | | | Second solid oxide | | |
|---|---|---|---|---|---|---|---|
| Sample | ALD Deposition temperature | Chemistry | Nb. of layers | Nb. of cycles/ layer | Chemistry | Nb. of layers | Nb. of cycles/ layer |
| 1 | — | — | — | — | — | — | — |
| 2 | 180° C. | $Al_2O_3$ | 1 | 25 | — | — | — |
| 3 | 180° C. | $ZrO_2$ | 1 | 50 | — | — | — |
| 4 | 180° C. | $Al_2O_3$ | 1 | 64 | — | — | — |
| 5 | 180° C. | $Al_2O_3$ | 1 | 64 | — | — | — |
| 6 | 180° C. | $ZrO_2$ | 1 | 70 | — | — | — |
| 7 | 180° C. | $Al_2O_3$ | 1 | 55 | $ZrO_2$ | 1 | 11 |
| 8 | 180° C. | $Al_2O_3$ | 1 | 32 | $ZrO_2$ | 1 | 35 |
| 9 | 180° C. | $Al_2O_3$ | 2 | 16 | $ZrO_2$ | 2 | 17 |
| 10 | 180° C. | $Al_2O_3$ | 4 | 8 | $ZrO_2$ | 4 | 9 |
| 11 | 180° C. | $Al_2O_3$ | 8 | 4 | $ZrO_2$ | 8 | 4 |
| 12 | 120° C. | $Al_2O_3$ | 2 | 16 | $ZrO_2$ | 2 | 17 |
| 13 | 240° C. | $Al_2O_3$ | 2 | 16 | $ZrO_2$ | 2 | 17 |
| 14 | 180° C. | $ZrO_2$ | 2 | 17 | $Al_2O_3$ | 2 | 16 |
| 15 | 180° C. | $ZrO_2$ | 4 | 9 | $Al_2O_3$ | 4 | 8 |
| 16 | 240° C. | $Al_2O_3$ | 2 | 16 | $SiO_2$ | 2 | 27 |
| 17 | 240° C. | $Al_2O_3$ | 2 | 24 | $SiO_2$ | 2 | 14 |

For the powder samples, the oxidation onset temperature was measured using a simultaneous thermal analyzer Q600 from TA instruments. The analyzer comprised a microbalance and a furnace enabling the measurement of weight change versus temperature. The powders were heated in air at a rate of 20° C. per minute and the onset of weight gain (oxidation) was determined.

Select powders were coated as described in table 1 and pressed into inductor cores to measure the initial magnetic permeability. These cores were placed into an oven at 180° C. and the resulting voltage difference was monitored over time to gage the thermal stability. In such a test, a voltage of 0 V is ideal indicating the existence of electrically insulating layers surrounding the iron powder. Contrastingly, a high voltage measurement indicates that insulating shell has become conductive and compromises the performance of the powder. Additionally, the voltage was monitored for the same sample at the start of the experiment, after 24 hours, after 48 hours, after 72 hours and after 96 hours. The lower the measured voltage was, the higher was the electrical resistivity of the sample Other magnetic cores produced using these powders were placed in a chamber maintained at 85° C. with 85% relative humidity (rH) to measure the corrosion resistance of the shell. The cores were visually inspected every 24 hours for appearance of rust stains. Cores prepared using powders 7, 9, 10 and 17 performed extremely well under these aggressive conditions in contrast to cores that were prepared with uncoated powder or using single oxides of comparable thickness (e.g. powders 3, 4, 5 and 6). For example, cores prepared with samples 1, 3, 4, 5 and 6 showed significant surface rust (>10% of exposed area), which was evident after only 24 hours of exposure to 85% relative humidity at 85° C. Contrastingly, powders 7, 9, 10 and 17 showed no evidence of surface rust even after 96 hours of exposure to the same conditions. The results indicate that the moisture induced corrosion resistance does not necessarily correlate to the oxidation onset temperature determined by the thermal analysis.

TABLE 2

| No. | Shell thickness [nm] | Oxidation onset temperature [° C.] | Relative Permeability [μ/μ$_0$] |
| --- | --- | --- | --- |
| 1 | — | 394 | 36.0 |
| 2 | 3.0 | 499 | 20.0 |
| 3 | 5.0 | 365 | 20.4 |
| 4 | 7.0 | 601 | 18.3 |
| 5 | 6.7 | 642 | 19.6 |
| 6 | 6.8 | 388 | 20.1 |
| 7 | 7.0 | 580 | 18.5 |
| 8 | 8.1 | 527 | 20.2 |
| 9 | 7.4 | 546 | 19.8 |
| 10 | 8.8 | 572 | 19.1 |
| 11 | 8.1 | 584 | 19.6 |
| 12 | 9.0 | 557 | 19.5 |
| 13 | 7.2 | 568 | 20.4 |
| 14 | 8.6 | 626 | 20.0 |
| 15 | 7.9 | 610 | 19.7 |
| 16 | 7.2 | 642 | 18.8 |
| 17 | 6.9 | 643 | 18.5 |

In table 2 the relative permeability refers to the permeability of a vacuum $\mu_0$.

TABLE 3

| No. | Voltage (0 hr) [V] | Voltage (24 hr) [V] | Voltage (48 hr) [V] | Voltage (72 hr) [V] | Voltage (96 hr) [V] | 85° C./85% rH corrosion resistance [visually assessed] |
| --- | --- | --- | --- | --- | --- | --- |
| 1 | 0 | >290 | — | — | — | Poor |
| 2 | — | — | — | — | — | — |
| 3 | 0 | 254 | >254 | >254 | >254 | Poor |
| 4 | 0 | 52 | >210 | — | — | Poor |
| 5 | 0 | 226 | — | — | — | Poor |
| 6 | 0 | 41 | 178 | 249 | — | Poor |
| 7 | 0 | 0.45 | 48 | 160 | 202 | Excellent |
| 8 | 0 | 7 | 203 | 242 | — | — |
| 9 | 0 | 0.15 | 31 | 170 | 218 | Excellent |
| 10 | 0 | 1.50 | 53 | 169 | 223 | Excellent |
| 11 | 0 | 77 | 188 | 248 | — | — |
| 17 | 0 | 223 | 278 | — | — | Excellent |

As illustrated in Tables 2 and 3, the presence of at least two solid oxides in the shell of the coated particles led to a high electrical resistivity (low voltage) and/or to superior corrosion resistance. At the same time, the coated particles still possessed a good magnetic permeability.

Further, cross-sections of powders were prepared using a focused ion beam (FIB) and examined using HAADF-STEM (High Angle Annular Dark Field—Scanning Transmission Electron Microscopy) with EDXS (Energy Dispersive X-ray Spectroscopy) to enable mapping the distribution of elements in the sample. Sample 7 was analyzed and it was shown that the iron particle, representing the core, was uniformly coated with alternating layers with a thickness of about 2 nm of alumina, zirconia, alumina and zirconia.

REFERENCE NUMERALS

1 Coated particle
3 Core
5 Shell
7 Iron
9 First solid oxide
11 Second solid oxide
13 Layer of a first solid oxide
15 Layer of a second solid oxide
17 Interface
19 Abscissae
21 Ordinate
23 Aluminum
25 Zirconium
29 Oxygen

The invention claimed is:

1. A soft-magnetic powder comprising coated particles, the coated particles comprising a core and a shell, the core having an average particle size $D_{50}$ in a range from 0.1 μm to 100 μm and comprising iron,
  wherein the shell has a thickness of not more than 20 nm and comprises at least two solid oxides and
  wherein the shell comprises at least three layers and the shell comprises more than one layers of a first solid oxide and at least one layer of a second solid oxide,
  wherein the more than one layers of the first solid oxide and the at least one layer of the second solid oxide are arranged in an alternating manner and
  wherein the core comprises carbonyl iron powder.

2. The soft-magnetic powder according to claim 1, wherein the number of layers of the first solid oxide comprised in the shell is equal to the number of layers of a second solid oxide comprised in the shell.

3. The soft-magnetic powder according to claim 1, wherein the shell comprises from 3 to 20 layers.

4. The soft-magnetic powder according to claim 1, wherein a thickness of each of the at least three layers is in a range from 0.1 nm to 5 nm.

5. The soft-magnetic powder according to claim 1, wherein each of the at least three layers is amorphous, crystalline or a combination thereof.

6. The soft-magnetic powder according to claim 1, wherein each of the at least two solid oxides is an oxide of a metal, a metalloid or a transition metal.

7. The soft-magnetic powder according to claim 6, wherein the metal is Al, the metalloid is Si and/or the transition metal is selected from the group consisting of Hf, Zn, Zr, Co, Mn, Ni and Ti.

8. The soft-magnetic powder according to claim 1, wherein a first solid oxide of the at least two solid oxides is $Al_2O_3$ and/or a second solid oxide of the least two solid oxides is $ZrO_2$ or $SiO_2$.

9. A process for the production of the soft-magnetic powder according to claim 1, wherein the shell is deposited on the core by Atomic Layer Deposition.

10. A process according to claim 9, wherein each of the at least three layers is produced by more than one cycle of Atomic Layer Deposition.

11. A coil core, magnetorheological fluid, power injection molding, radio-frequency identification tag or electromagnetic shielding comprising the soft-magnetic powder according to claim 1.

12. An electronic component comprising the soft-magnetic powder according to claim 1.

* * * * *